United States Patent
Ramamurthy

(10) Patent No.: US 8,817,562 B2
(45) Date of Patent: Aug. 26, 2014

(54) DEVICES AND METHODS FOR CONTROLLING MEMORY CELL PRE-CHARGE OPERATIONS

(75) Inventor: Hema Ramamurthy, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 84 days.

(21) Appl. No.: 13/563,224

(22) Filed: Jul. 31, 2012

(65) Prior Publication Data

US 2014/0036610 A1 Feb. 6, 2014

(51) Int. Cl.
*G11C 7/00* (2006.01)
*G11C 7/12* (2006.01)
*G11C 7/10* (2006.01)

(52) U.S. Cl.
CPC ............... *G11C 7/12* (2013.01); *G11C 7/1048* (2013.01)
USPC .......................................... 365/203; 365/154

(58) Field of Classification Search
CPC ................................. G11C 7/12; G11C 7/1408
USPC ....................... 365/203, 154, 185.25
See application file for complete search history.

(56) References Cited

U.S. PATENT DOCUMENTS

| | | | | |
|---|---|---|---|---|
| 5,546,346 A | * | 8/1996 | Agata et al. | 365/203 |
| 5,642,324 A | | 6/1997 | Ghosh et al. | |
| 5,761,123 A | * | 6/1998 | Kim et al. | 365/185.21 |
| 5,781,469 A | * | 7/1998 | Pathak et al. | 365/156 |
| 5,815,432 A | * | 9/1998 | Naffziger et al. | 365/154 |
| 5,973,972 A | * | 10/1999 | Kwon et al. | 365/203 |
| 6,005,793 A | * | 12/1999 | Tran | 365/154 |
| 6,104,666 A | * | 8/2000 | Kumar | 365/230.06 |
| 6,515,927 B2 | * | 2/2003 | Kitamoto et al. | 365/189.15 |
| 6,631,093 B2 | | 10/2003 | Kumar et al. | |
| 7,184,341 B2 | * | 2/2007 | Yuan et al. | 365/203 |
| 7,218,562 B2 | | 5/2007 | Campbell | |
| 8,064,271 B2 | * | 11/2011 | Houston | 365/189.06 |
| 2011/0149666 A1 | | 6/2011 | Chang et al. | |

* cited by examiner

*Primary Examiner* — Tan T. Nguyen
(74) *Attorney, Agent, or Firm* — Mary Jo Bertani; James L. Clingan, Jr.

(57) ABSTRACT

A memory having a memory array having bit cells coupled to bit lines. The memory further includes a precharge circuit that precharges bit lines. The memory also includes a control circuit coupled to the precharge circuit that enables the precharge circuit at a beginning portion of a read cycle, keeps the precharge circuit disabled until an end of the read cycle, and keeps the precharge circuit disabled during a write cycle. A method of operating a memory, in which the memory includes an array of memory cells coupled to bit lines, includes precharging the bit lines at a beginning of a read cycle. The method also includes blocking precharging of the bit lines for a duration of a write cycle.

18 Claims, 5 Drawing Sheets

DEVICES AND METHODS FOR CONTROLLING MEMORY CELL PRE-CHARGE OPERATIONS

BACKGROUND

1. Field

This disclosure relates generally to semiconductor devices, and more specifically, to controlling pre-charge operations for memory cells.

2. Related Art

Static random access memory (SRAM) is a form of volatile semiconductor memory. Rows and columns of memory cells are interconnected to each other to form a memory cell array. Wordlines are connected to rows of the memory cells within a memory cell array. Bit lines are connected to columns of the memory cells within a memory cell array. Wordlines and bit lines are used to read from and write to selected memory cells. Each memory cell includes a pair of cross-coupled inverters that receive and output data on a bus. One inverter is coupled to a bit line bus and the other inverter is coupled to a bit line_not bus. A sense amplifier is provided to sense a difference between the voltages on the bit line busses, and produce an appropriate logic output value corresponding to the state of the memory element.

To properly detect the voltage differential presented at bit line and bit line-not busses during a read operation, the bit line and bit line_not buses are "precharged" to a supply voltage before the particular memory cell is accessed. After a write operation, the bitline and bitline bar busses are separated full rail and the precharge operation following a write operation is one of the biggest contributors to dynamic power consumption in a memory cell array. As devices that use memory become increasingly smaller and portable, it is desirable to reduce the amount of power consumed for precharge operations.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of systems and methods are disclosed that reduce the total dynamic power consumed by a memory during write precharge operation in an SRAM memory by precharging the bit lines only if the pending operation is a read operation. The peak and average power consumed by the SRAM memories is therefore significantly reduced during write operations.

Figure 1:
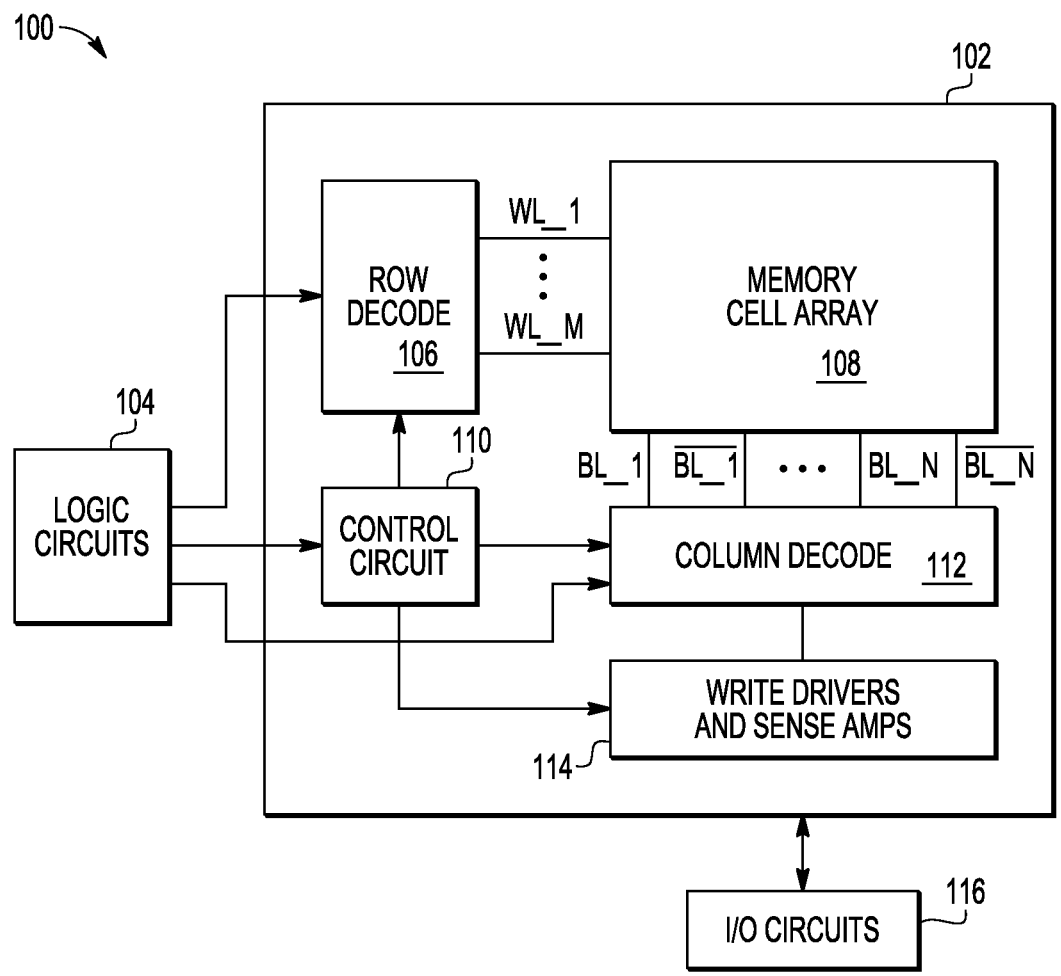
FIG. 1 illustrates an embodiment of a memory system in accordance with the present invention.

Referring now to the drawings, FIG. 1 illustrates an embodiment of memory system 100 in accordance with the present invention. As shown, memory system 100 includes memory device 102 coupled to logic circuits 104. Specifically, logic circuits 104 are coupled to row decoder 106 and column decoder 112 of memory device 102 via address lines. Logic circuits 104 are also coupled to control circuit 110 of memory device 102 via control lines. In addition, logic circuits 104 are coupled to input/output circuits 116 via input/output lines.

Memory device 102 includes write drivers and sense amplifiers 114 and static random access memory (SRAM) cell array 108. SRAM cell array 108 includes a number of wordlines (i.e., WL_1 through WL_m) and a number of bit line pairs (i.e., BL_1 through BL_n and BL_1b through BL_nb). Along with write drivers and sense amplifiers 114, SRAM cell array 108 is constructed to use a memory cell sensing scheme such that each bit line pair is used in reading and writing data into SRAM cell array 108.

Figure 2:
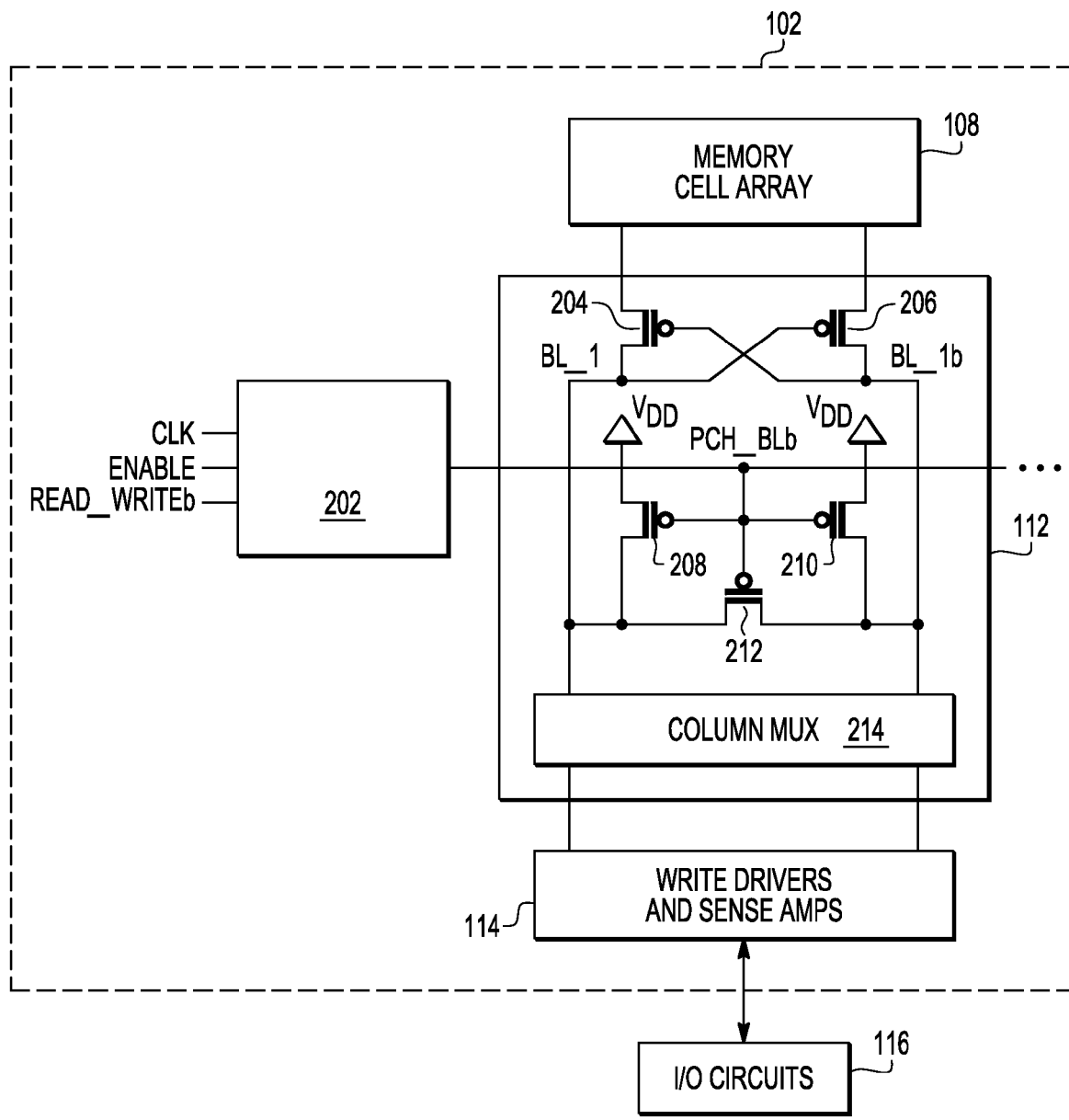
FIG. 2 illustrates further detail of an embodiment of some of the components in the memory system of FIG. 1.

FIG. 2 illustrates further detail of an embodiment of some of the components in the memory system 100 of FIG. 1. The Control circuit 100 includes a logic circuit with input signals including 'clk', 'enable' and 'read_writeb' signals and an output signal precharge bitline bar (PCH_BLb). Control circuit 110 sets the read_writeb signal high when a read operation is performed and low when a write operation is performed. The 'clk', 'enable' and 'read_writeb' signals are used to generate the precharge signal, PCH_BLb, used to control the bitline precharge operation.

Column logic 112 includes equalization circuit having a first PMOS transistor 204 with a first current electrode coupled to memory cell array 108 and a second current electrode coupled to the BL_1 signal, and a second PMOS transistor 206 with a first current electrode coupled to memory cell array 108 and a second current electrode coupled to the BL_1b signal. The control electrodes of PMOS transistors 204, 206 are cross-coupled so that the control electrode of PMOS transistor 204 is coupled to the BL_1b signal and the control electrode of PMOS transistor 206 is coupled to the BL_1 signal. Equalization circuit 204, 206 equalizes voltages on the bit lines after the bit lines are sensed by the sense amplifier 114 during read and write clock cycles.

Column logic 112 further includes precharge circuitry having PMOS transistors 208, 210, 212. A first current electrode of PMOS transistors 208, 210 is coupled to a supply voltage VDD. A second current electrode of PMOS transistor 208 is coupled to a first current electrode of PMOS transistor 212, and a second current electrode of PMOS transistor 210 is coupled to a second current electrode of PMOS transistor 212. The control electrodes of PMOS transistors are coupled to the precharge bit line bar (PCH_BLb) signal. The first current electrode of PMOS transistor 212 is coupled to the BL_1 signal and the second current electrode of PMOS transistor 212 is coupled to the BL_1b signal.

The BL_1 and BL1_b signals are coupled between column multiplexer 214 and a corresponding column in memory cell array 108. The column multiplexer 214 is coupled to write drivers and sense amplifiers 114 via sense amp signals.

Figure 3:
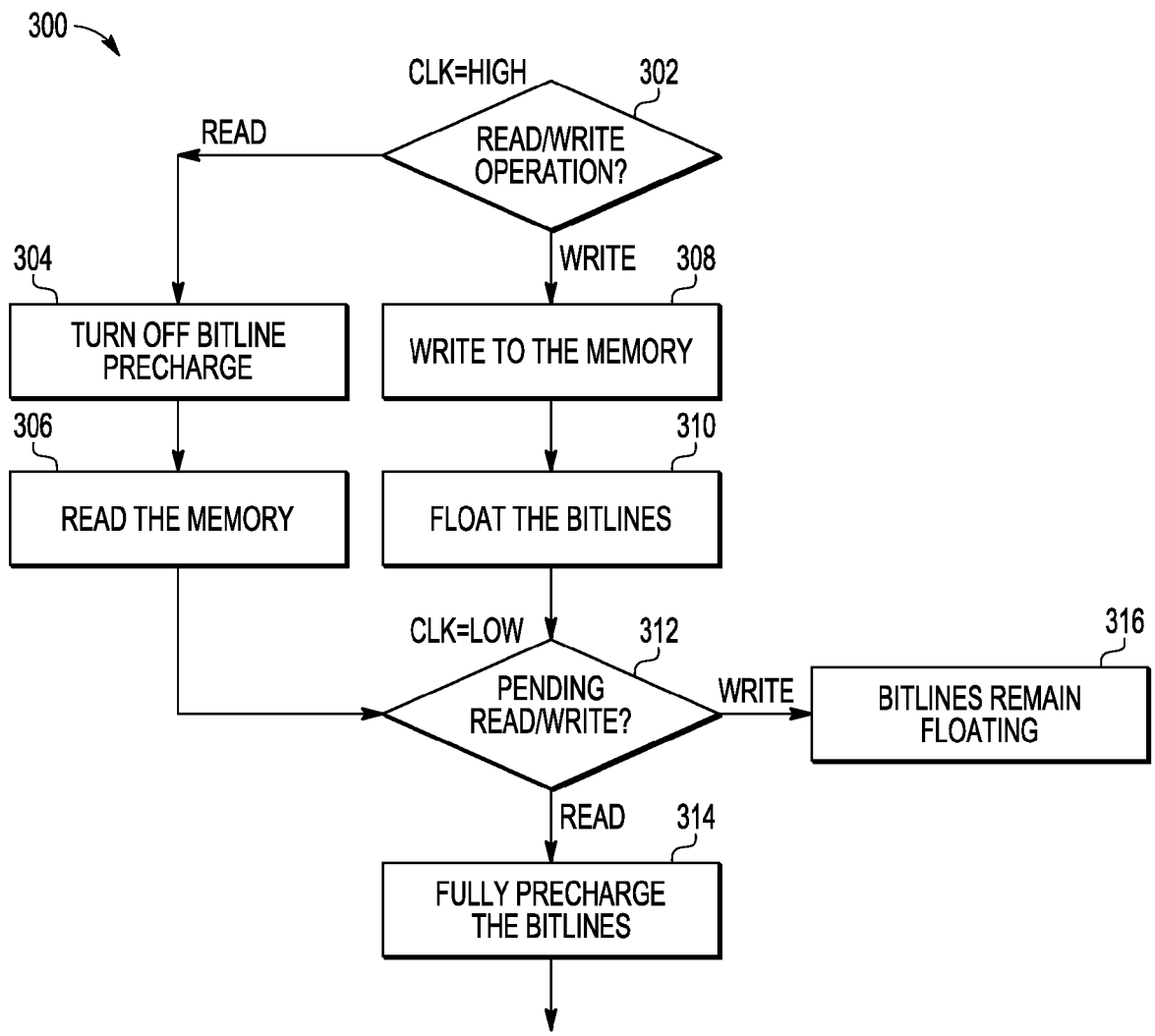
FIG. 3 illustrates a flow diagram of an embodiment of a method for controlling precharge operations in the memory system of FIG. 1.

Operation of memory device 102 will now be described with reference to FIGS. 1-6. FIG. 3 illustrates a flow diagram of an embodiment of a method 300 for controlling precharge operations in the memory system 100 of FIG. 1. Method 300 can be implemented in control circuit 110 or other suitable component of memory system 100. Process 302 includes determining whether a read or write operation is being performed. If a read operation is being performed, process 302 transitions to process 304 to turn off the bit line precharge signal (PCH_BLb asserted, FIG. 2). Process 306 performs the read operation by reading the selected memory cells in memory cell array 108.

Process 306 transitions to process 312 to determine whether a read or write operation is pending. If a read operation is pending, process 314 fully precharges the bit lines by enabling the precharge circuit. If a write operation is pending process 316 allows the bit lines to remain floating.

Returning to process 302, if a write operation is being performed, process 302 transitions to process 308 to write data to the selected memory cells in memory cell array 108. Process 310 includes allowing the bit line signals for the selected memory cells to float since the bit line signals are not driven to any particular voltage and conductors for the bit line signals do not have a resistive path to ground.

Process 310 transitions to process 312 to determine whether a read or write operation is pending. If a read operation is pending, process 314 fully precharges the bit lines by enabling the precharge circuit. The precharge operation can be completed in parallel with the word line generation so that the bit lines are at full rail reference voltage (VDD) for the read sense operation. If a write operation is pending process 316 allows the bit lines to remain floating.

Figure 4:
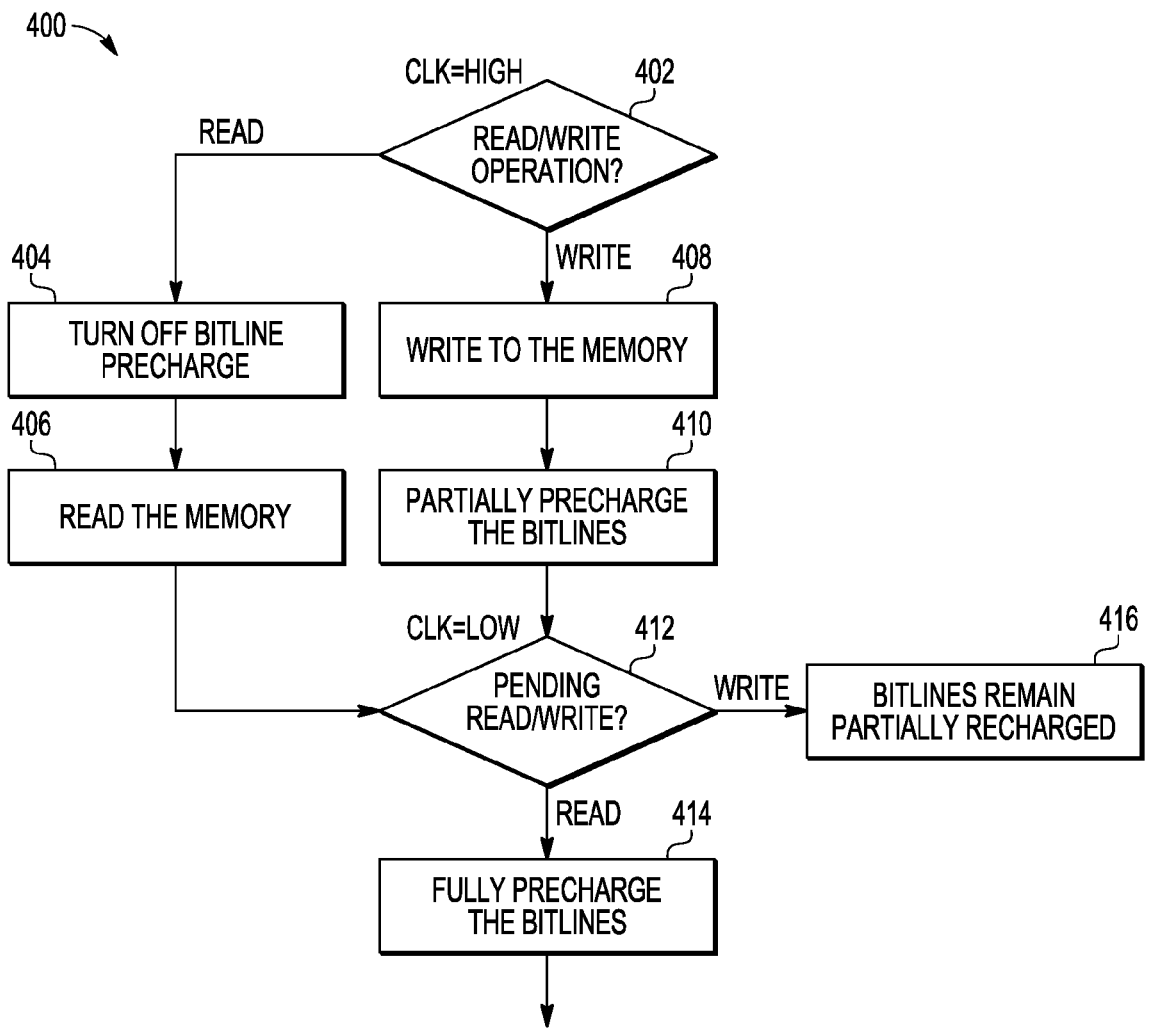
FIG. 4 illustrates a flow diagram of another embodiment of a method for controlling precharge operations in the memory system of FIG. 1.

FIG. 4 illustrates a flow diagram of an embodiment of a method 400 for controlling precharge operations in the memory system 100 of FIG. 1. Method 400 can be implemented in control circuit 110 or other suitable component of memory system 100. Process 402 includes determining whether a read or write operation is being performed. If a read operation is being performed, process 402 transitions to process 404 to turn off the bit line precharge signal (PCH_BLb asserted, FIG. 2). Process 406 performs the read operation by reading the selected memory cells in memory cell array 108.

Process 406 transitions to process 412 to determine whether a read or write operation is pending. If a read operation is pending, process 414 fully precharges the bit lines by enabling the precharge circuit. If a write operation is pending process 416 allows the bit lines to remain floating.

Returning to process 402, if a write operation is being performed, process 402 transitions to process 408 to write data to the selected memory cells in memory cell array 108. Process 410 includes partially precharging the selected bit lines.

Figure 5:
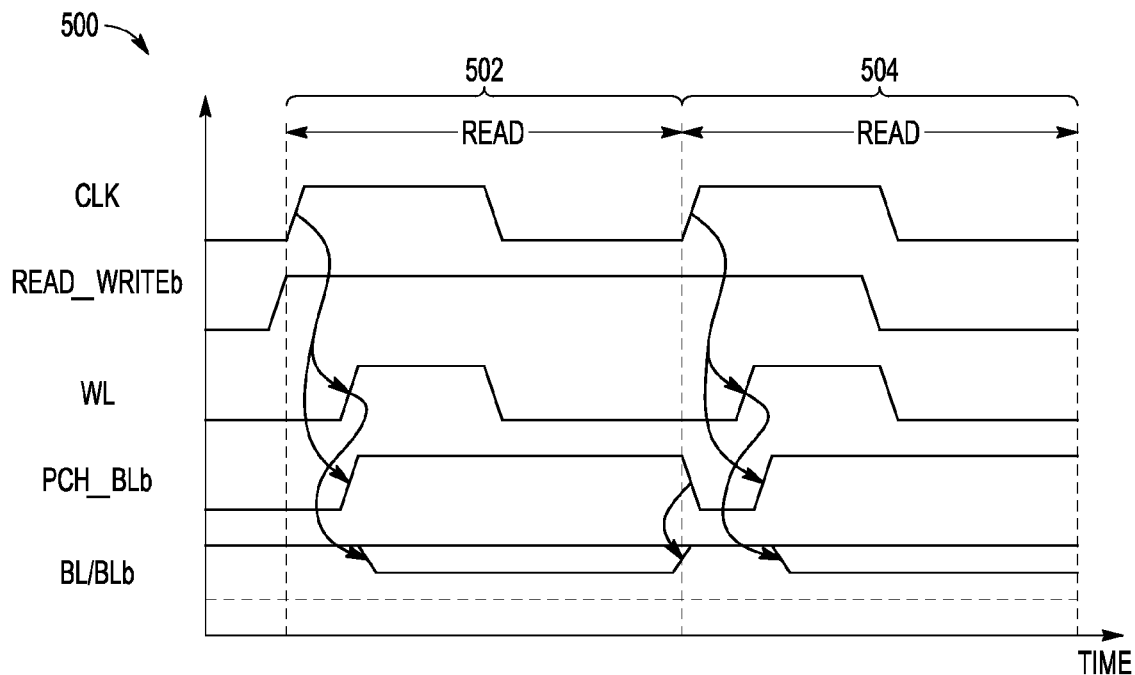
FIG. 5 illustrates a timing diagram for precharging memory cells for a read operation followed by another read operation in the memory system of FIG. 1.

Process 410 transitions to process 412 to determine whether a read or write operation is pending. If a read operation is pending, process 414 fully precharges the bit lines by enabling the precharge circuit. The precharge operation can be completed in parallel with the wordline generation so that the bit lines are at full rail reference voltage (VDD) for the read sense operation. The time required to fully precharge the bit lines will be reduced since the bit lines have already been partially precharged in process 410. If a write operation is pending process 416 allows the bit lines to remain partially precharged to reduce power consumption in the following write cycle Referring to FIGS. 2 and 5, FIG. 5 illustrates a timing diagram 500 for precharging memory cells for a read operation followed by another read operation in the memory system 100 of FIG. 1. The read_writeb signal is set before the clock signal is set high at or before the start of read clock cycle 502. Before the word line is asserted at a beginning portion of read clock cycle 502, the precharge circuit is disabled, as indicated by the signal PCH_BLb being asserted. When the read is completed the PCH_BLb is not deasserted till the beginning of the next read cycle. The precharge circuit remains disabled during the rest of read clock cycle 502 until a beginning portion of the next read clock cycle 504. The bit line pairs are then precharged during a first portion of the read clock cycle 504 and the logic state of the selected bit lines is sensed during a subsequent portion of the read clock cycle 504. The output signal PCH_BLb of NAND gate 202 is set low to enable the precharge circuit in the memory device 102 at the start of read clock cycle 504. The word line signals for selected row(s) of the memory cells are set to enable address latching and decode operations in parallel with the precharge operation. The bit line and bit line bar signals (BL and BLb) are shown as being brough t to a precharge voltage level once the output of NAND gate 202 is set high. The read_write bar signal remains set throughout clock cycle 502 and a portion of clock cycle 504. If another read is pending after clock cycle 504, the read_writeb signal can remain set until a pending write signal is detected. When the second read clock cycle 504 starts, the precharge signal ckt is set low, which causes the output of NAND gate 202 (PCH-BLb) to go low and shut off the precharging of the bit lines until the memory cells are read.

Figure 6:
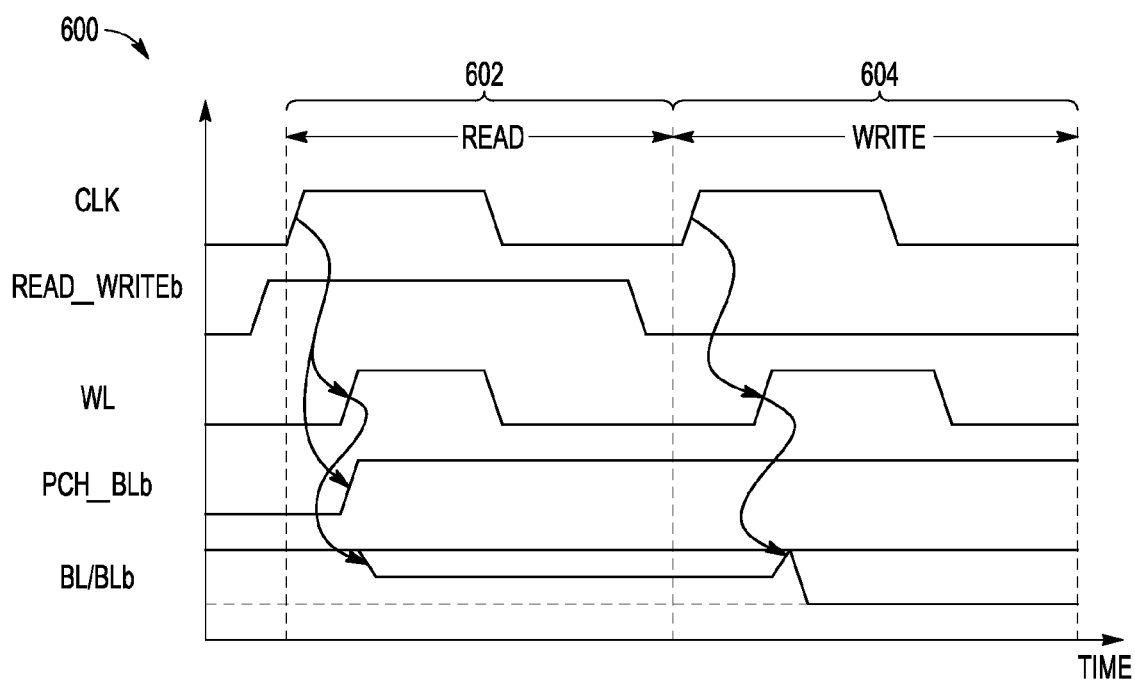
FIG. 6 illustrates a timing diagram for precharging memory cells for a read operation followed by a write operation in the memory system of FIG. 1.

Referring to FIGS. 2 and 6, FIG. 6 illustrates a timing diagram 600 for precharging memory cells for a read operation in clock cycle 602 followed by a write operation during clock cycle 604 in the memory system 100 of FIG. 1. The read_writeb signal is set high before clock cycle 602 to indicate a read operation is being performed and low before clock cycle 604 to indicate that a write operation is being performed. In the beginning of the read cycle, the precharge is disabled by asserting the PCH_BLb signal. Once the read completes and the bit line and bitline bar signals are separated, the bitlines are not precharged and remain floating for the remainder of the read cycle. Thus the bitlines are not precharged since a pending write operation was detected.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

By now it should be appreciated that there has been provided a memory system or device 100 capable of saving power during precharge operations by disabling precharging of bit lines when a write operation follows a read operation.

In some embodiments, a memory 100 that can comprise a memory cell array 108 having memory cells coupled to bit lines BL1, BL1b, BLN, BLNb; a precharge circuit 208, 210, 212 that precharges bit lines; and a control circuit 110 coupled to the precharge circuit that enables the precharge circuit at a beginning portion of a read cycle, keeps the precharge circuit disabled until an end of the read cycle 502, 504, 602, and keeps the precharge circuit disabled during a write cycle 604.

In another aspect, the control circuit 110 can determine if the write cycle 604 immediately follows the read cycle 602 in which case the precharge circuit remains disabled from an end of the beginning portion of the read cycle until an end of the write cycle.

In another aspect, the control circuit 110 can keep the precharge circuit disabled continuously during consecutive write cycles.

In another aspect, the control circuit 110 can the control circuit determines if the read cycle follows the write cycle and if so, responds by enabling the precharge circuit 208, 210, 212 during the beginning portion of the read cycle 502, 602, 504.

In another aspect, an equalization circuit 204, 206 can be coupled to a pair of the bit lines.

In another aspect, the equalization circuit can equalize voltages on the pair of bit lines after sensing during the read cycle.

In another aspect, the equalization circuit can equalize voltages on the pair of bit lines in a beginning portion of the write cycle.

In another aspect, the bit lines can remain floating during a write except for bit lines that are selected for writing.

In another aspect, the precharge circuit can comprise a first transistor 208 having a first current electrode coupled to a first bit line, a control electrode coupled to receive a precharge signal, and second current electrode coupled to a power supply terminal; a second transistor 210 having a first current electrode coupled to a complementary first bit line, a control electrode coupled to receive precharge signal, and a second current electrode coupled to the power supply terminal; and a third transistor 212 having a first current electrode coupled to the complementary first bit line, a control electrode coupled to receive precharge signal, and second current electrode coupled to the first bit line.

In another aspect, the control circuit can comprise a logic circuit 202, responsive to a read_write control signal, having an output that provides the precharge signal.

In another embodiment, a method of operating a memory having an array of memory cells 108 coupled to bit lines BL1, BL1b, BLN, BLNb, can comprise: precharging the bit lines at a beginning of a read cycle 602; and blocking precharging of the bit lines for a duration of a write cycle 604.

In another aspect, the method can further comprise continuously blocking the precharging of the bit lines during consecutive write cycles.

In another aspect, if the write cycle precedes the read cycle, the precharging of the bit lines at the beginning of the read cycle can be in response to a read signal being active when a first clock edge occurs.

In another aspect, the memory cell array can have a plurality of word lines, the method can further comprise floating the bit lines (BL1, BL1b, BLN, BLNb) during the write cycle except when a selected word line of the plurality of word lines is active.

In another aspect, the method can further comprise determining if the read cycle follows the write cycle and if so, precharging the bit lines at the beginning of the read cycle.

In another aspect, the method can further comprise equalizing pairs of the bit lines after sensing during the read cycle.

In another aspect, the method can further comprise floating the bit lines during a write except for bit lines that are selected for writing.

In another embodiment, a method of operating a memory 100 having a plurality of memory cells, a plurality of bit line pairs BL1, BL1b, BLN, BLNb, and a plurality of word lines, can comprise precharging the plurality of bit line pairs during a first portion of a first read cycle 502, 602; and sensing 306 a logic state of a selected bit line pair during a second portion of the first read cycle. The second portion of the first read cycle is subsequent to the first portion of the first read cycle. If a next cycle is a second read cycle 504, the bit line pairs can be precharged during a first portion of the second read cycle, concurrent to the decoding of the wordlines. A logic state of a selected bit line pair can be sensed during a second portion of the second read cycle. The second portion of the second read cycle can be subsequent to the first portion of the second read cycle. If the next cycle is a first write cycle 604, precharging of the plurality of bit line pairs can be blocked for a duration of the first write cycle.

In another aspect, if the next cycle is the first write cycle 604, the method can further comprise floating deselected pairs of the bit lines for the duration of the first write cycle.

In another aspect, if the next cycle is the first write cycle 604, the method can further comprise equalizing 204, 206 deselected pairs of the bit lines for the duration of the first write cycle.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Further, although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory, comprising:
   a memory array having bit cells coupled to bit lines;
   a precharge circuit that precharges bit lines; and
   a control circuit coupled to the precharge circuit that enables the precharge circuit at a beginning portion of a read cycle, keeps the precharge circuit disabled until an end of the read cycle, keeps the precharge circuit disabled during a write cycle; and if a next cycle is a first write cycle, equalizes deselected pairs of the bit lines for the duration of the first write cycle.

2. The memory of claim 1, wherein the control circuit determines if the write cycle immediately follows the read cycle in which case the precharge circuit remains disabled from an end of the beginning portion of the read cycle until an end of the write cycle.

3. The memory of claim 2, wherein the control circuit keeps the precharge circuit disabled continuously during consecutive write cycles.

4. The memory of claim 1, wherein the control circuit determines if the read cycle follows the write cycle and if so, responds by enabling the precharge circuit during the beginning portion of the read cycle.

5. The memory of claim 4, further comprising an equalization circuit coupled to a pair of the bit lines.

6. The memory of claim 5, wherein the equalization circuit equalizes voltages on the pair of bit lines after sensing during the read cycle.

7. The memory of claim 5, wherein the equalization circuit equalizes voltages on the pair of bit lines in a beginning portion of the write cycle.

8. The memory of claim 1, wherein the bit lines remain floating during a write except for bit lines that are selected for writing.

9. The memory of claim 1, wherein the precharge circuit comprises:
   a first transistor having a current electrode coupled to a first bit line, a first control electrode coupled to receive a precharge signal, and second current electrode coupled to a power supply terminal;
   a second transistor having a current electrode coupled to a complementary first bit line, a first control electrode coupled to receive precharge signal, and second current electrode coupled to the power supply terminal; and
   a third transistor having a current electrode coupled to the complementary first bit line, a first control electrode coupled to receive precharge signal, and second current electrode coupled to the first bit line.

10. The memory of claim 9, wherein the control circuit comprises a logic circuit, responsive to a read_write control signal, having an output that provides the precharge signal.

11. A method of operating a memory having an array of memory cells coupled to bit lines, comprising:
    precharging the bit lines at a beginning of a read cycle; and
    blocking precharging of the bit lines for a duration of a write cycle, wherein the memory array has a plurality of word lines, further comprising floating the bit lines during the write cycle except when a selected word line of the plurality of word lines is active.

12. The method of claim 11, further comprising continuously blocking the precharging of the bit lines during consecutive write cycles.

13. The method of claim 12, wherein if the write cycle precedes the read cycle, the precharging of the bit lines at the beginning of the read cycle is in response to a read signal being active when a first clock edge occurs.

14. The method of claim 11, determining if the read cycle follows the write cycle and if so, precharging the bit lines at the beginning of the read cycle.

15. The method of claim 14, further comprising equalizing pairs of the bit lines after sensing during the read cycle.

16. The method of claim 11, further comprising, in parallel with performing the read cycle, latching an address for a selected word line, decoding the address to identify the selected word line, and enabling the selected word line.

17. A method of operating a memory having a plurality of bit cells, a plurality of bit line pairs, and a plurality of word lines, comprising:
    precharging the plurality of bit line pairs during a first portion of a first read cycle;
    sensing a logic state of a selected bit line pair during a second portion of the first read cycle, wherein the second portion of the first read cycle is subsequent to the first portion of the first read cycle;
    if a next cycle is a second read cycle, precharging the bit line pairs during a first portion of the second read cycle and sensing a logic state of a selected bit line pair during a second portion of the second read cycle, wherein the second portion of the second read cycle is subsequent to the first portion of the second read cycle; and
    if the next cycle is a first write cycle, blocking precharging of the plurality of bit line pairs for a duration of the first write cycle and equalizing deselected pairs of the bit lines for the duration of the first write cycle.

18. The method of claim 17, if the next cycle is the first write cycle, further comprising floating deselected pairs of the bit lines for the duration of the first write cycle.

* * * * *